(12) United States Patent
Kawaguchi et al.

(10) Patent No.: US 6,946,798 B2
(45) Date of Patent: Sep. 20, 2005

(54) PLASMA DISPLAY APPARATUS

(75) Inventors: Takao Kawaguchi, Osaka (JP); Toshio Fujimura, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/468,231

(22) PCT Filed: Apr. 2, 2003

(86) PCT No.: PCT/JP03/04199

§ 371 (c)(1),
(2), (4) Date: Aug. 18, 2003

(87) PCT Pub. No.: WO03/085630

PCT Pub. Date: Oct. 16, 2003

(65) Prior Publication Data

US 2004/0196277 A1 Oct. 7, 2004

(30) Foreign Application Priority Data

Apr. 4, 2002 (JP) ........................... 2002-102339

(51) Int. Cl.[7] .................................. H01J 1/52
(52) U.S. Cl. ........................... 315/85; 349/59
(58) Field of Search ............... 315/85, 246, 167; 345/904, 905; 349/59, 138

(56) References Cited

U.S. PATENT DOCUMENTS 6,160,349 A * 12/2000 Nagai ................. 315/85
6,359,390 B1 * 3/2002 Nagai ................ 315/169.1
6,646,391 B2 * 11/2003 Okamoto et al. ......... 315/246

FOREIGN PATENT DOCUMENTS

| JP | 3-34694 | 2/1991 |
|---|---|---|
| JP | 3-165428 | 7/1991 |
| JP | 7-201581 | 8/1995 |
| JP | 10-125532 | 5/1998 |
| JP | 2807672 | 7/1998 |
| JP | 10-199447 | 7/1998 |
| JP | 10-336687 | 12/1998 |
| JP | 11-330886 | 11/1999 |
| JP | 2000-91143 | 3/2000 |
| JP | 2000-196977 | 7/2000 |
| JP | 2001-68031 | 3/2001 |
| JP | 2001-358494 | 12/2001 |
| JP | 2002-6757 | 1/2002 |
| JP | 2002-258790 | 9/2002 |

* cited by examiner

Primary Examiner—Don Wong
Assistant Examiner—Jimmy Vu
(74) Attorney, Agent, or Firm—Wenderoth, Lind & Ponack, L.L.P.

(57) ABSTRACT

The plasma display apparatus has a noise filter circuit with a noise filter connected to an AC supply disposed at the back side of a plasma display panel. The plasma display apparatus also has a back cover composed of a magnetic metal material disposed at the back side of the plasma display panel to cover the noise filter circuit, wherein magnetic lines of force in a core, made of magnetic material and including the noise filter direct approximately identical to the in-plane direction of the back cover. The configuration can eliminate audible noises because the amount of leakage flux passing through the back cover is reduced.

13 Claims, 6 Drawing Sheets

PLASMA DISPLAY APPARATUS

TECHNICAL FIELD

The present invention relates to a plasma display apparatus known as a large-sized, flat and lightweight display apparatus.

BACKGROUND ART

Recently, a plasma display apparatus has become an attractive subject as a display panel (flat display device) with excellent visibility; and the technology is steadily advancing for large-sized screen with high definition.

The plasma display panels are roughly divided into AC powered and DC powered in driving method, and into surface discharge and counter discharge in discharging method. Currently, however, surface discharge AC powered structure has become a mainstream technology from a view point of high definition, large screen and simplified manufacturing method.

Now, a structure of the plasma display panel used in the plasma display apparatus is described with reference to FIG. 8.

A plurality of arrays of stripe shaped display electrodes 2 comprised of a paired scan electrode and sustain electrode are formed on transparent front substrate 1 composed of glass or the like. Dielectric layer 3 is formed to cover the arrays of the electrodes, and protective layer 4 is formed on dielectric layer 3.

A plurality arrays of stripe shaped address electrodes 7 covered by overcoat layer 6 are formed on rear substrate 5, placed to face against front substrate 1, to cross display electrodes 2 comprised of scan electrodes and sustain electrodes. A plurality of ribs 8 are provided on overcoat layer 6 parallel to and between address electrodes 7, and fluorescent layers 9 are applied on side surfaces of ribs 8 and on surfaces of overcoat layer 6.

These substrate 1 and substrate 5 are positioned to face each other so that display electrodes 2 comprised of scan electrodes and sustain electrodes intersect address electrodes 7 at approximately right angles to form a narrow discharge space sandwiched between these substrates, and are sealed in surrounding peripheries. The discharge space is filled with one of rare gases, such as Helium, Neon, Argon or Xenon, or a mixture of them, as a discharge gas. The discharge space divided into a plurality of partitions by ribs 8 creates a plurality of tiny discharge cells where intersection points of display electrodes 2 and address electrodes 7 are located, and each discharge cell is provided with one of fluorescent layers 9 of red, green and blue in this order.

FIG. 9 illustrates a wiring diagram of electrodes arrangements for the plasma display panel used in the plasma display apparatus. Pairs of scan electrode and sustain electrode, and address electrodes form an M times N matrix array that has scan electrode codes of SCN 1 to SCN M and sustain electrode codes of SUS 1 to SUS M arranged in row directions, and address electrode codes of D 1 to D N arranged in column directions.

In the plasma display panel with electrodes arranged as discussed above, a writing pulse supplied between an address electrode and a scan electrode generates address discharge between address electrode and scan electrode. Selecting suitable discharge cells, a sustaining discharge then starts between scan electrode and sustain electrode to show a required display by applying on alternative, periodically flipping sustaining pulse on the scan electrode and sustain electrode.

The plasma display apparatus employing a plasma display panel of above structure has such a configuration that the panel fixed on front side of a chassis and driving circuitries mounted on back side of the chassis are included in the housing comprised of a front frame and a back cover (See JP. Pat. No. 2,807,672).

However, the plasma display apparatus has had a drawback to cause audible noises when low-cost iron instead of aluminum is used for the back cover.

The higher audible noises occur in low AC supply of 100 V in Japan and 120 V in US compared with high AC supply of 200 to 240 V as the input current becomes larger.

In particular, the problem is that the phenomenon becomes worse in plasma display apparatus using an AC/DC rectifier with a capacitor input type filter.

SUMMARY OF THE INVENTION

The plasma display apparatus disclosed comprises: a noise filter circuit having a noise filter disposed at the back side of the plasma display panel; and a back cover composed of a magnetic metal material disposed at the back side of the plasma display panel to face against the noise filter circuit, wherein the noise filter comprised of a core made of a magnetic material and a wiring wound on the core, and magnetic lines of force in the core direct approximately identical to an in-plane direction of the back cover.

DETAILED DESCRIPTION OF THE INVENTION

The plasma display apparatus used in the exemplary embodiments of this invention are described with reference to FIGS. 1 to 8.

Figure 1:
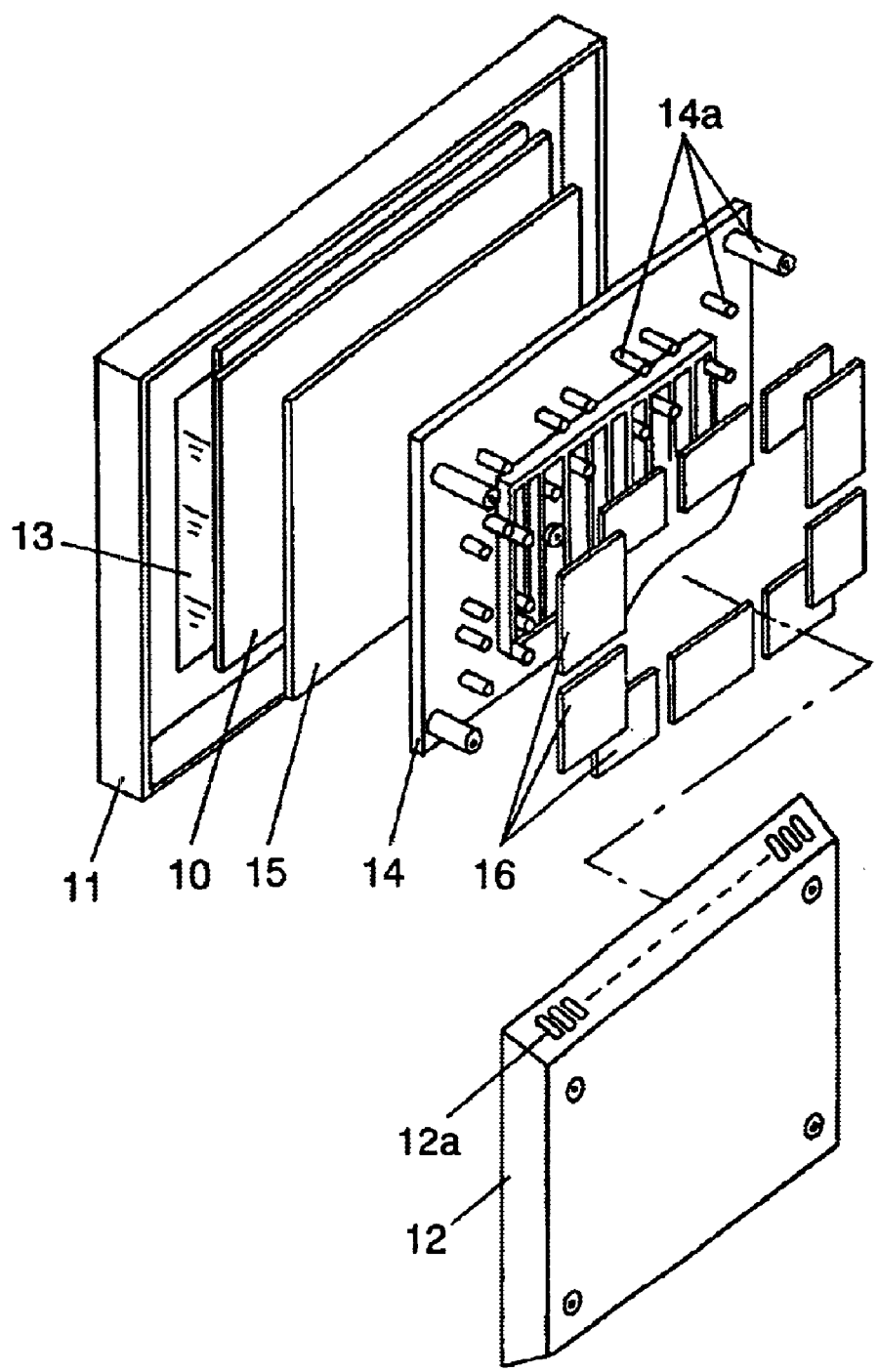
FIG. 1 illustrates an exploded perspective view showing an inner positioning of the plasma display apparatus used in the exemplary embodiment of the present invention.

First, an overall structure of the plasma display apparatus is described using FIG. 1.

Figure 8:
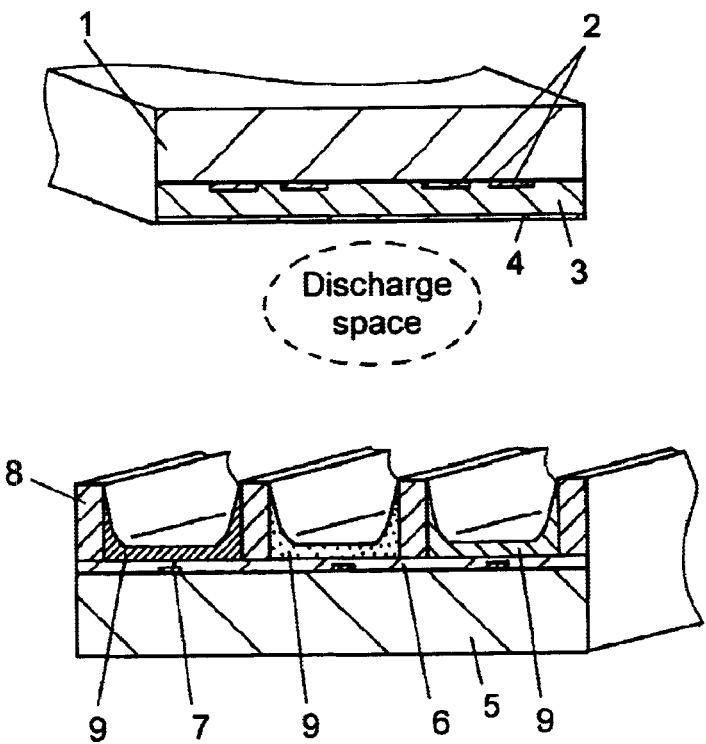
FIG. 8 illustrates a schematic perspective view showing a structure of a plasma display panel of a conventional plasma display apparatus.
Figure 9:
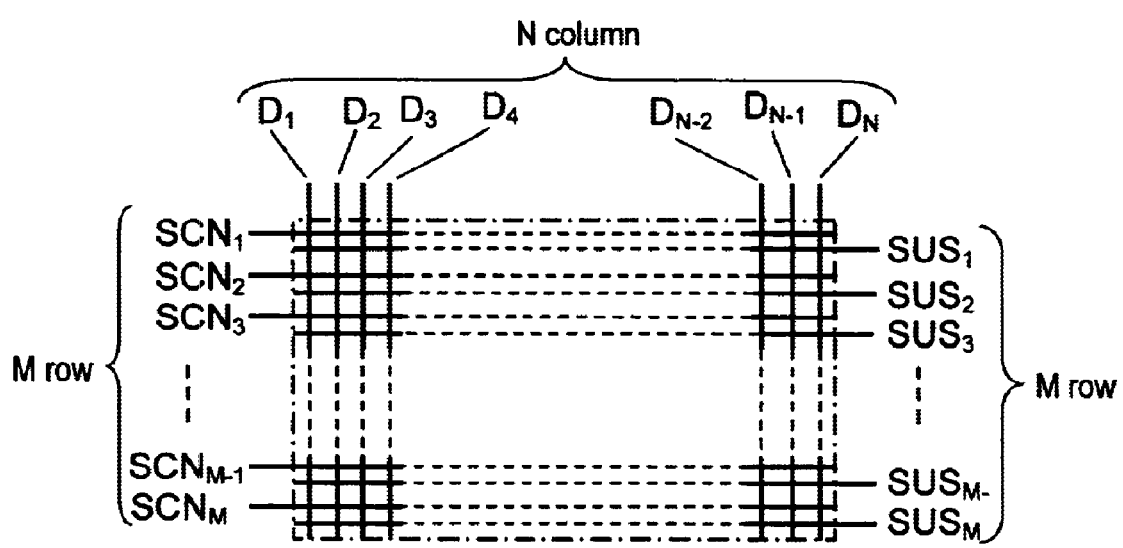
FIG. 9 illustrates a schematic view showing electrodes arrangement of a plasma display panel of a conventional plasma display apparatus.

In FIG. 1, a housing to house panel 10 shown in FIG. 8 is comprised of front frame 11 composed of resin or metal, and back cover 12 made of magnetic metal composed of iron or the like as a basic ingredient. An optical filter and front glass 13 made of glass or the like, serves as a protector of panel 10 as well, is disposed at an opening of front frame 11. Additionally, front glass 13 is provided with, for instance, a silver deposition or net-like metal material to shield the radiation of unnecessary electromagnetic wave. A plurality of vents 12a are provided in back cover 12 to radiate heat generated in panel 10 to outside.

Panel 10 is fixed by bonding to front surface of chassis 14 made of aluminum or the like. The chassis 14 serves as a panel elements holder and a heat radiator as well, via heat conductive material 15. A plurality of circuit blocks 16 to drive panel 10 for displaying is mounted on the back side of chassis 14. Heat conductive material 15 serves to conduct heat generated in panel 10 to chassis 14 for efficient radiation. Circuit block 16 has electrical circuits to drive and control panel 10 for displaying, and whose external terminals provided on peripheries of panel 10 are electrically connected to a plurality of flexible wiring plates (not shown) protruding on all sides of chassis 14.

Back side of chassis 14 has bosses 14a, formed by die-casting, for setting circuit blocks 16 or fixing back cover 12. This chassis 14 can replace the aluminum plate with fixed pins.

Figure 2:
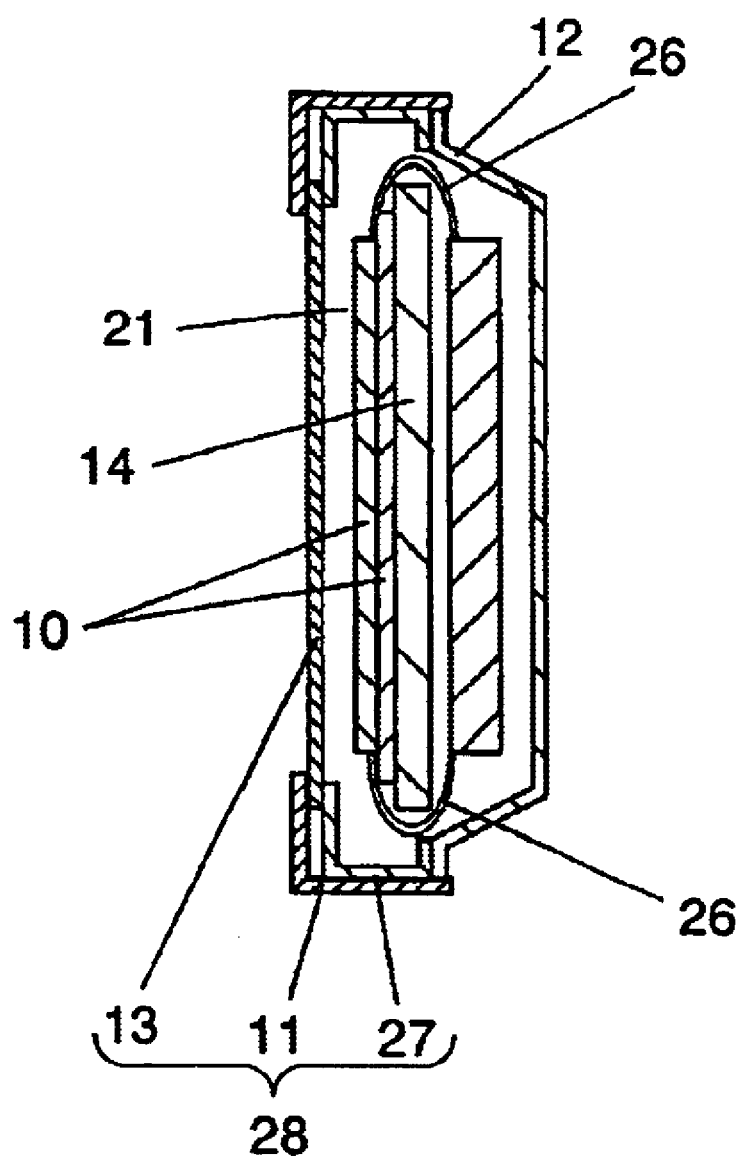
FIG. 2 illustrates a schematic cross-sectional view showing an inner structure of the plasma display apparatus.
Figure 3:
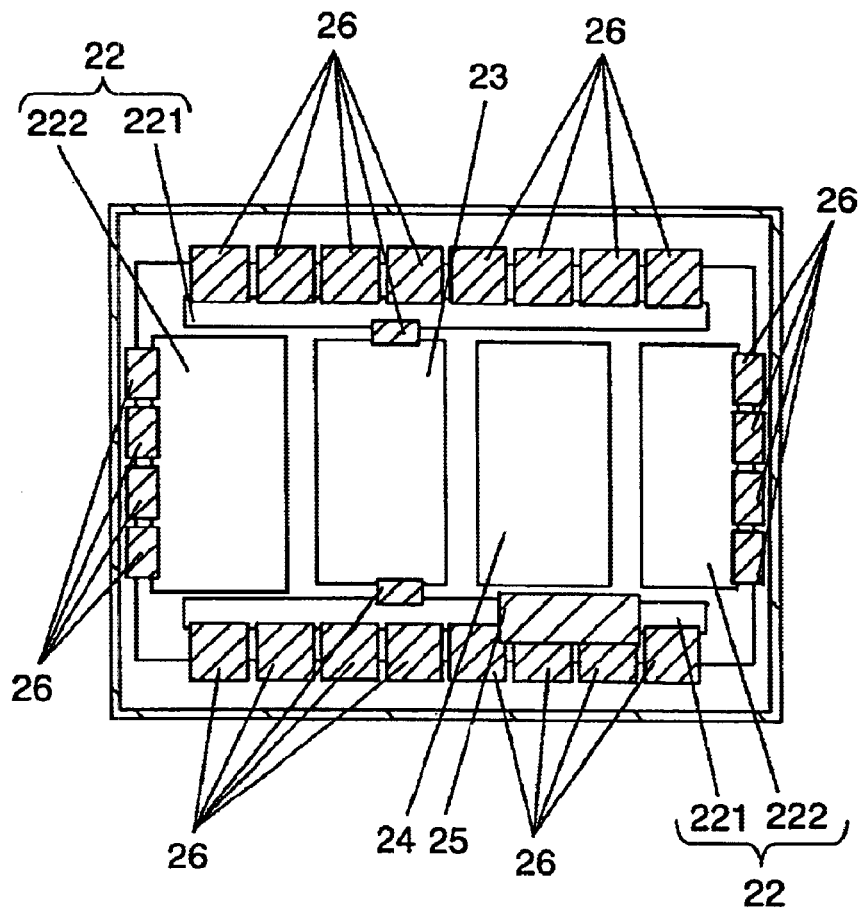
FIG. 3 illustrates a schematic plan view showing a structure of the plasma display apparatus without back cover.

FIG. 2 and FIG. 3 illustrate the structures of substantial parts of the plasma display apparatus used in the exemplary embodiment of the present invention. As shown in FIG. 2, the plasma display apparatus comprises:

(a) panel body 21 including chassis 14 for heat radiation mounted on the back side of panel 10 having the structure shown in FIG. 8;

(b) driving circuits 22 including data drivers 221 to supply data for prescribed discharge cells to discharge, and discharge drivers 222 for driving discharge cells of panel 10 to discharge as shown in FIG. 3;

(c) driving signal processor 23 to supply signals for driving circuits 22 to drive panel body 21;

(d) power source 24 having an AC/DC rectifier with capacitor input type filter to supply electricity to driving circuits 22 and driving signal processor 23; and (e) noise filter circuit 25, having a noise filter, connected between power source 24 and an AC supply.

Panel body 21, driving circuit 22 and driving signal processor 23 are connected mutually using flexible wiring plates 26. Additionally, respective circuits are connected with conducting wires, not shown in the drawing, for signal sending and power supply.

Moreover, as mentioned above, the plasma display apparatus has front cover 28 at the front side including front glass 13 fixed on front frame 11 pressed by plate 27 to protect panel body 21, and back cover 12 at the back side made of magnetic metal composed of iron or the like as a basic ingredient.

Front cover 28, together with back cover 12, constructs the housing of the plasma display apparatus.

Figure 4:
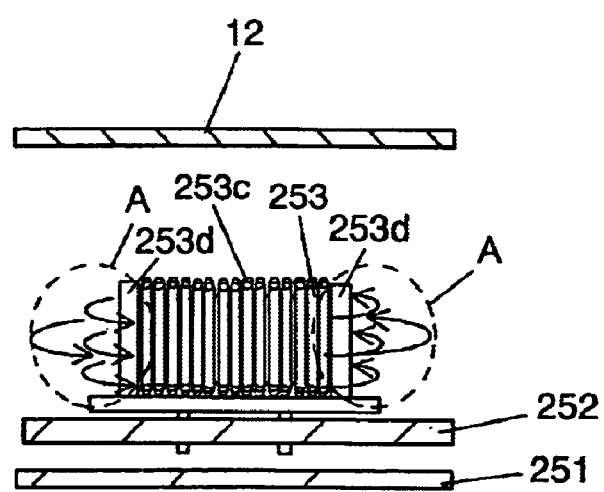
FIG. 4 illustrates a front view showing a structure of a substantial part of the plasma display apparatus.
Figure 5:
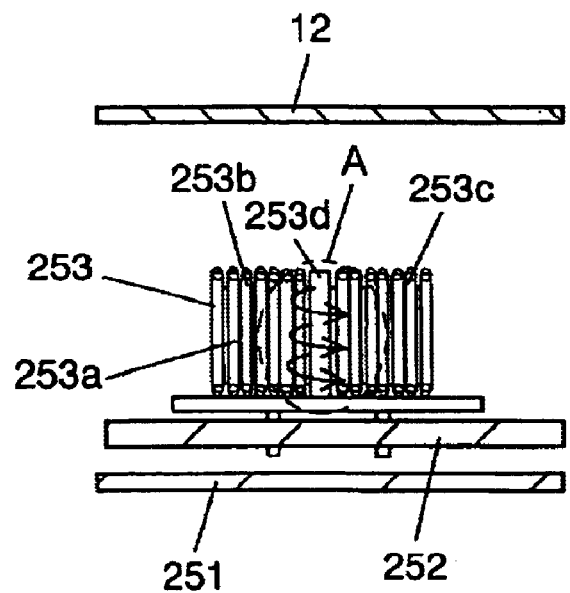
FIG. 5 illustrates a side view showing a structure of a substantial part of the plasma display apparatus.
Figure 6:
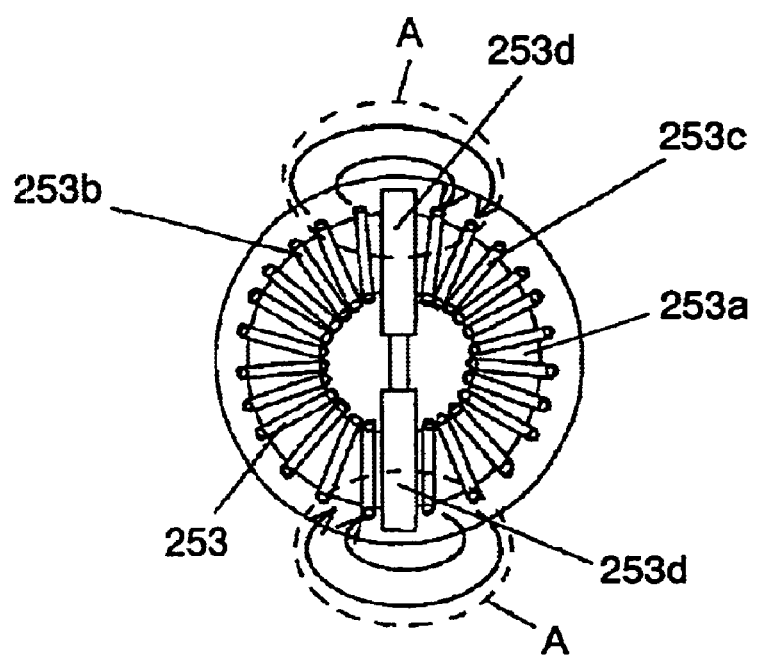
FIG. 6 illustrates a top plan view showing a structure of a substantial part of the plasma display apparatus.

As shown in FIGS. 4 to 6, print circuit substrate 252 including noise filter circuit 25 is fixed on attachment 251. Print circuit substrate 252 has a common mode noise filter, a film capacitor, not shown in the drawings, to eliminate noises, surge absorbers and fuses or the like.

FIG. 4 illustrates a front view showing the noise filter, FIG. 5 illustrates a side view of the same and FIG. 6 illustrates a top plan view of the same. Mark A shows the direction of leakage flux in these drawings.

Common mode noise filter 253 typically uses toroidal cores 253a having closed magnetic path geometries. First winding 253b and second winding 253c are disposed on toroidal core 253a to face each other, and the connecting direction of winding ends 253d of first winding 253b and second winding 253c, facing each other, are arranged approximately identical with an in-plane direction of back cover 12. Namely, the direction of magnetic lines of force of noise filter 253 comprised of toroidal core 253a, a magnetic material, is approximately identical to the in-plane direction of a plane adjacent to back cover 12.

Figure 7:
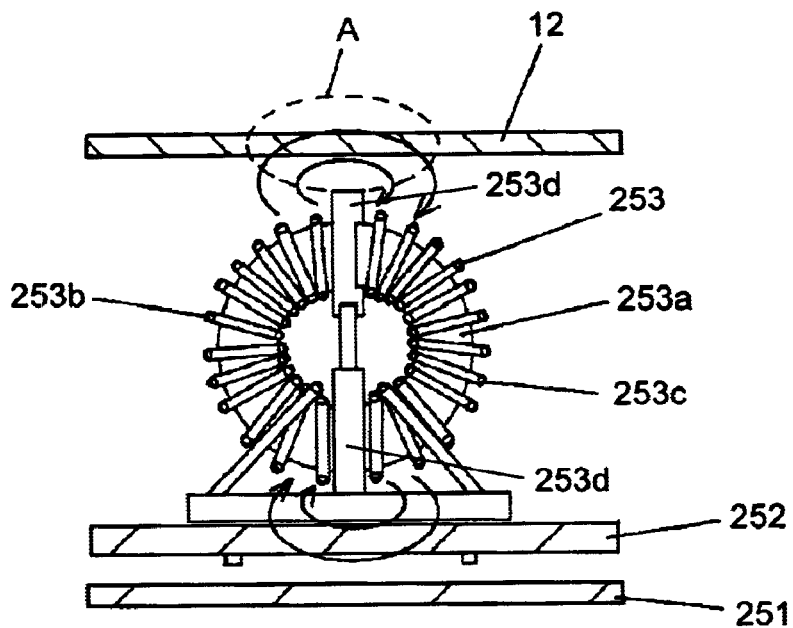
FIG. 7 illustrates a front view showing a structure of a substantial part of a conventional plasma display apparatus.

FIG. 7 shows a positioning of noise filter 253 in a conventional plasma display apparatus. In conventional art, noise filter 253 is disposed so that the direction of magnetic lines of force of noise filter 253 is perpendicular to the direction of the in-plane direction of back cover 12. Therefore, leakage flux from noise filter 253 affects back cover 12 resulting vibrations on back cover 12 due to variation of the leakage flux to cause audible noise.

On the other hand, the configuration disclosed in this invention makes the direction of leakage flux generated between first winding 253b and second winding 253c of common mode noise filter 253 approximately identical to the in-plane direction of back cover 12. Also, a large clearance between noise filter 253 and back cover 12 enables a reduction in the amount of leakage flux passing through back cover 12.

Consequently, audible noise can be reduced which has been generated by repetition of absorption forces between noise filter 253 and back cover 12 owing to leakage flux variations due to AC input current synchronized by frequency of AC supply.

In particular, the power supply with a low-cost capacitor input type filter cannot be employed in conventional art because peak value of input AC current becomes larger than in the case of power supply with an active filter. The configuration of the present invention, however, can reduce the audible noise further if the power source with a capacitor input type filter is adopted.

Additionally, low AC supply of 100 V in Japan and 120 V in US generates higher noises compared with high AC supply of 200 to 240 V due to a larger input current.

In the above-mentioned example, back cover 12 is described to also act as a packaging of the housing. Instead of back cover 12 made of a metal, back cover 12 covered in a case made of a synthetic resin for packaging can perform the same effects.

As mentioned above, the plasma display apparatus disclosed in this invention can reduce the amount of leakage flux, generated between windings of different polarities of AC line, passing through back cover 12 because the noise filter comprised of a core made of a magnetic material has magnetic lines of force directed approximately identical to the in-plane direction of the cover. The configuration, therefore, can eliminate audible noises caused by the leakage flux passing through back cover 12.

INDUSTRIAL APPLICABILITY

The present invention relates to a plasma display apparatus known as large-sized, slim and lightweight display technology, which can reduce the amount of leakage flux, generated between windings of different polarities of ac line, passing through the back cover and can, therefore, eliminate audible noises caused by the leakage flux passing through the back cover.

What is claimed is:

1. A plasma display apparatus comprising:
 a noise filter circuit having a noise filter disposed at a back side of a plasma display panel; and a back cover comprising a magnetic metal material disposed at the back side of the plasma display panel to face against said noise filter circuit, wherein said noise filter includes a toroidal core made of a magnetic material and a winding wound on said toroidal core, and wherein said toroidal core is disposed so that magnetic flux direction in said toroidal core is parallel to a plane of said back cover.

2. The plasma display apparatus of claim 1, further comprising a chassis, wherein the plasma display panel is fixed on a front side of said chassis and said noise filter circuit is mounted on a back side of said chassis.

3. The plasma display apparatus of claim 1, wherein said back cover is a portion of a housing of the plasma display apparatus.

4. The plasma display apparatus of claim 1, wherein said back cover comprises iron.

5. A plasma display apparatus comprising:

a noise filter circuit having a noise filter disposed at a back side of a plasma display panel; and a back cover comprising a magnetic metal material disposed at the back side of the plasma display panel to face against said noise filter circuit, wherein said noise filter includes a core made of magnetic material and a winding wound on said core, and magnetic lines of force in said core direct approximately identical to an in-plane direction of said back cover, wherein said core comprises a toroidal core having closed magnetic path geometry, and said winding comprises a first winding and a second winding, wherein said first winding and said second winding are disposed to face each other on said toroidal core, and wherein a connection direction of winding ends, facing each other, of said first winding and said second winding are arranged approximately identical to the in-plane direction of said back cover.

6. A plasma display apparatus comprising:

a chassis having a plasma display panel fixed on a front side of the chassis;

a driver disposed on a back side of said chassis to drive the plasma display panel;

a power source to supply electric power to said driver;

a noise filter circuit having a noise filter and being connected between said power source and an AC supply; and a back cover comprising a magnetic metal material disposed to cover said driver, said power source and said noise filter circuit, wherein said noise filter comprises a first winding and a second winding disposed to face each other on a toroidal core having closed magnetic path geometry, and wherein a connection direction of winding ends, facing each other, of said first winding and said second winding are arranged approximately identical to an in-plane direction of said back cover.

7. The plasma display apparatus of claim 6, wherein said power source comprises an AC/DC rectifier with a capacitor input type filter.

8. The plasma display apparatus of claim 6, wherein said power source has a supply voltage of 100 to 120 V.

9. The plasma display apparatus of claim 6, wherein said back cover is a portion of a housing of the plasma display apparatus.

10. The plasma display apparatus of claim 6, wherein said back cover comprises iron.

11. The plasma display apparatus of claim 5, further comprising a chassis, wherein the plasma display panel is fixed on a front side of said chassis and said noise filter circuit is mounted on a back side of the chassis.

12. The plasma display apparatus of claim 5, wherein said back cover is a portion of a housing of the plasma display apparatus.

13. The plasma display apparatus of claim 5, wherein said back cover comprises iron.

* * * * *